US007460372B2

(12) United States Patent
Liao et al.

(10) Patent No.: US 7,460,372 B2
(45) Date of Patent: Dec. 2, 2008

(54) FIXING MEANS FOR HEAT DISSIPATER

(75) Inventors: Chih-Peng Liao, Chung-Ho (TW); Yi-He Huang, Chung-Ho (TW)

(73) Assignee: Cooler Master Co., Ltd., Taipei (TW)

( * ) Notice: Subject to any disclaimer, the term of this patent is extended or adjusted under 35 U.S.C. 154(b) by 37 days.

(21) Appl. No.: 11/623,747

(22) Filed: Jan. 16, 2007

(65) Prior Publication Data

US 2007/0211437 A1 Sep. 13, 2007

(30) Foreign Application Priority Data

Mar. 7, 2006 (TW) .............................. 95203742 U

(51) Int. Cl.
*H05K 7/20* (2006.01)
*A47B 97/00* (2006.01)

(52) U.S. Cl. ....................... 361/704; 361/719; 257/718; 257/727; 165/80.3

(58) Field of Classification Search ....................... None
See application file for complete search history.

(56) References Cited

U.S. PATENT DOCUMENTS 5,761,041 A * 6/1998 Hassanzadeh et al. ....... 361/704
6,105,215 A * 8/2000 Lee ............................ 24/458
6,229,703 B1 * 5/2001 Lee ............................ 361/704
6,282,093 B1 * 8/2001 Goodwin .................... 361/704
6,330,908 B1 * 12/2001 Lee et al. .................... 165/185
6,373,703 B2 * 4/2002 Johnson et al. ............. 361/704
6,462,945 B2 * 10/2002 Sloan et al. ................. 361/687
6,496,371 B2 * 12/2002 Winkel et al. ............... 361/703
6,507,981 B1 * 1/2003 Bosak et al. .................. 24/457
6,563,716 B1 * 5/2003 Truong et al. ............... 361/816
6,724,632 B2 * 4/2004 Lee et al. .................... 361/719
6,816,375 B2 * 11/2004 Kalyandurg ................ 361/704
6,958,913 B2 * 10/2005 Koo ........................... 361/704
7,055,589 B2 * 6/2006 Lee et al. .................... 165/185
7,095,614 B2 * 8/2006 Goldmann .................. 361/704
7,327,573 B2 * 2/2008 Lee et al. .................... 361/704

* cited by examiner

*Primary Examiner*—Boris L Chervinsky

(57) ABSTRACT

A fixing means for a heat dissipater is provided to position the heat dissipater and a heat-generating element, which includes a heat-dissipating base and a positioning frame. The surface of the heat-dissipating base is provided with a plurality of heat-dissipating pieces. The center of the plurality of heat-dissipating pieces is provided with a sliding groove. Further, the positioning frame is formed into a T-lettered shape and constituted of a transverse rod and a pressing end. The pressing end is accommodated in the sliding groove of the base to abut against the surface of the base. Both side faces of the transverse rod are provided with a screw hole, respectively, for receiving a locking element. With the downward force generated by the connection of the locking element, the pressing end of the positioning frame can be caused to abut against the surface of the base, thereby to efficiently press the gravity center of the base and fix the position of the heat dissipater with respect to the heat-generating element.

7 Claims, 6 Drawing Sheets

3
23
2
22
1
12
21
13
11
22
221
23
3
2
21
1
12
13
11

FIXING MEANS FOR HEAT DISSIPATER

BACKGROUND OF THE INVENTION

1. Field of the Invention

The present invention relates to a heat-dissipating structure, and in particular to means for fixing a heat dissipater.

2. Description of Prior Art

With the increasing demand for a compact size, electronic devices are continuously developed to be more and more compact, causing a demand for a high heat-dissipating efficiency. Therefore, in order to enhance the heat-dissipating efficiency of the electronic device, a most common way of dissipating heat is to directly assemble a heat-dissipating assembly onto a heat-generating element. Especially, a heat-dissipating structure with a plurality of heat-dissipating pieces having high heat-dissipating efficiency is brought into direct contact with the heat-generating element via a heat-conducting medium, thereby to enhance the heat-dissipating performance of the heat-generating element. In view of this, it is an important issue to develop how to firmly connect the heat-generating element with the heat-dissipating structure having a plurality of heat-dissipating pieces.

In prior art, a most common way of dissipating heat is that a base of the heat-dissipating structure is directly mounted on the heat-generating element, and a heat-conducting glue is applied to the connecting surfaces between the base and the heat-generating element, so that the base and the heat-generating element can be firmly adhered with each other to perform the heat conduction smoothly. However, since the electronic device having the heat-dissipating structure may be hit during the conveyance or other such situations, deviation or displacement may inevitably occur at the connecting surfaces, connected by adhesives, of the base of the heat-dissipating structure and the heat-generating element, which substantially reduces the heat-dissipating efficiency.

Therefore, in a later conventional art, a locking element is used to fix the base of the heat-dissipating structure and the heat-generating element. As shown in FIG. 1, the heat-dissipating structure 10 has a base 101 for directly abutting against a heat-generating element. A plurality of heat-dissipating pieces 102 is provided on the base 101. Further, the bottom of the base 101 is provided with a sliding groove 103 for penetrating both sides of the base 101. The sliding groove 103 is provided with a fixing rod 104 therein. Both ends of the fixing rod 104 are provided with a screw hole 104*a* and 104*b*, respectively, for connecting to a locking element 11. The fixing action of the locking element 11 produces a downward force. With the pressing of the fixing rod 104 penetrating through the base 101, the heat-dissipating structure and the heat-generating element can be fixedly connected.

In the above-mentioned structure, the fixing rod 104 is provided below the base 101, and the screw holes 104*a* and 104*b* on both ends of the fixing rod 104 are used together with the locking elements 11 to produce a fixing effect. Viewed from another view angle, as shown in FIG. 2, the position of the fixing rod 104 cannot efficiently press the gravity center of the heat-dissipating structure 10 and thus is bent, which causes the fixing rod 104 to only press both sides of the base 101 in a manner of point contact. Therefore, it is easy for the fixing rod 104 to slide under an external force, which causes the heat-dissipating structure to displace with respect to the heat-generating element. As a result, the heat-dissipating effect of the heat-dissipating structure 10 is substantially reduced, and the locking effect of the locking element is also reduced in practice. Therefore, there is still much room for improvement.

SUMMARY OF THE INVENTION

In view of the above drawbacks, the present invention is to provide a fixing means for a heat dissipater, which has a positioning and pressing effect. A sliding groove is provided on the heat-dissipating base having a plurality of heat-dissipating pieces. A positioning frame having a pressing end is accommodated in the sliding groove to tightly abut against the surface of the base, thereby to assure that the positioning frame can accurately press the gravity center of the heat dissipater via the positioning of the pressing end. In this way, the heat-dissipater and the heat-generating element can be tightly connected.

The present invention provides a fixing means for a heat dissipater, which comprises a heat-dissipating base and a positioning frame. The surface of the heat-dissipating base is provided with a plurality of heat-dissipating pieces. The center of the plurality of heat-dissipating pieces is provided with a sliding groove. Further, the positioning frame is formed into a T-lettered shape and constituted of a transverse rod and a pressing end. The pressing end is accommodated in the sliding groove of the base to abut against the surface of the base. Both side faces of the transverse rod are provided with a screw hole, respectively, for receiving a locking element. With the downward force generated by the connection of the locking element, the pressing end of the positioning frame can be caused to abut against the surface of the base, thereby to efficiently press the gravity center of the base and fix the position of the heat dissipater with respect to the heat-generating element.

DETAILED DESCRIPTION OF THE INVENTION

Figure 1:
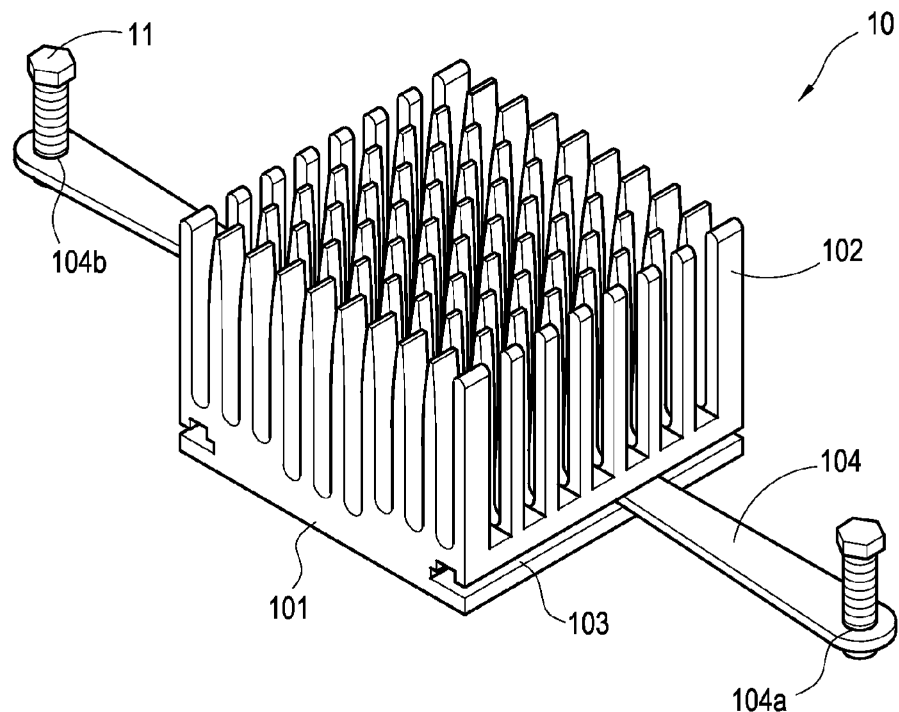
FIG. 1 is a schematic view showing the structure of a prior art.
Figure 2:
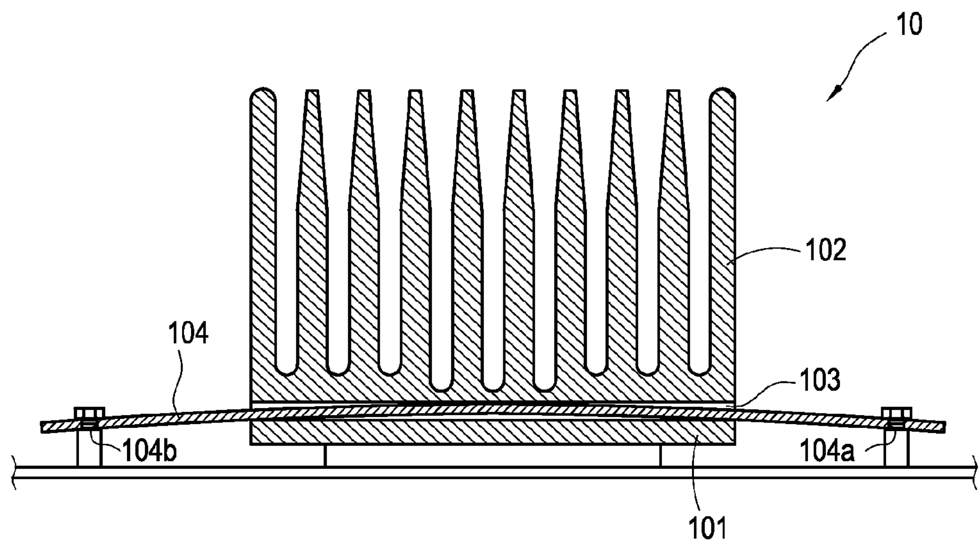
FIG. 2 is a schematic view showing the operation of a prior art.
Figure 3:
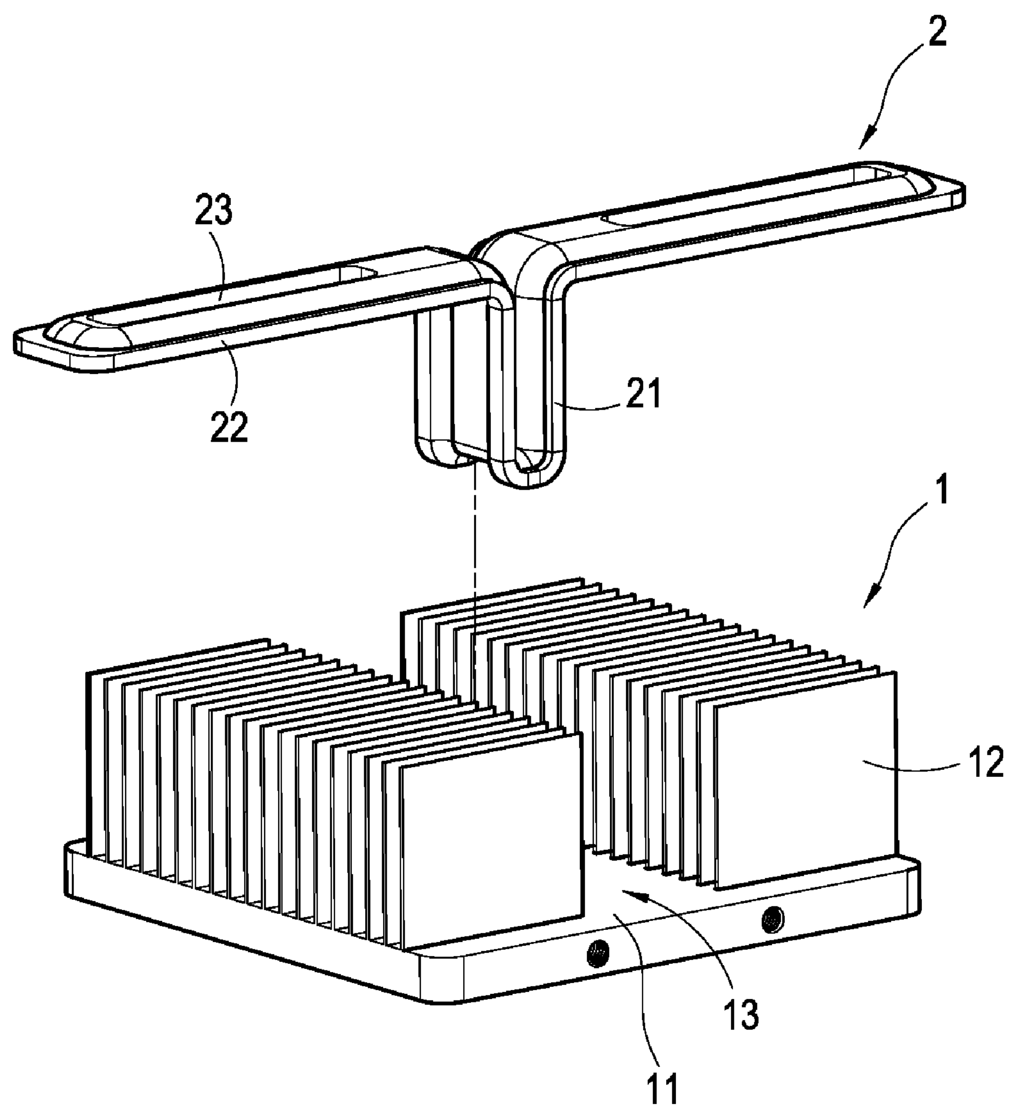
FIG. 3 is an explode view showing the structure of the present invention.
Figure 4:
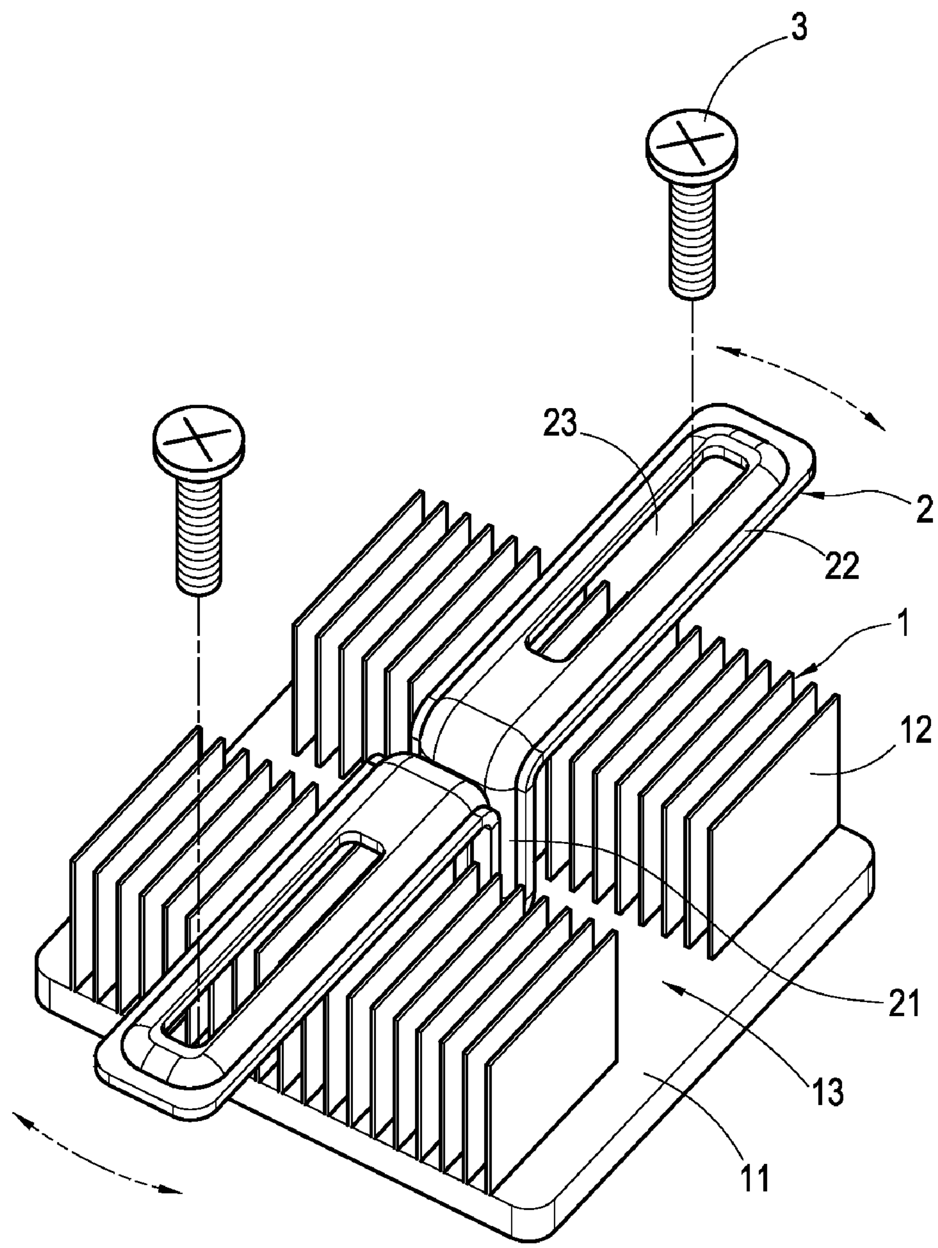
FIG. 4 is a schematic view showing the assembling operation of the locking element of the present invention.

With reference to FIG. 3, it is an exploded view showing the structure of the present invention. The present invention comprises a heat-dissipating base 1 and a positioning frame 2. One surface of the base 1 is provided with a plurality of parallel heat-dissipating pieces 12. The center of the plurality of heat-dissipating pieces 12 is provided with a sliding groove 13 perpendicular to the orientation of the heat-dissipating pieces 12. Further, the positioning frame 2 is formed into a T-lettered shape and constituted of a pressing end 21 and a transverse rod 22. The pressing end 21 is located at a central position of the transverse rod 22 and accommodated in the sliding groove 13 of the base 1 to abut against the surface 11 of the base 1. In the present embodiment, the pressing end 21 is bent to form into a pillar-like shape. The pressing end 21 and the transverse rod 22 are integrally formed into a T-lettered shape. The transverse rod 22 of the positioning frame 2 is flat. Both end faces of the transverse rod 22 are provided thereon with a screw hole 23, respectively, for receiving a locking element 3 (FIG. 4). In the present invention, the locking element 3 is a screw.

Figure 5:
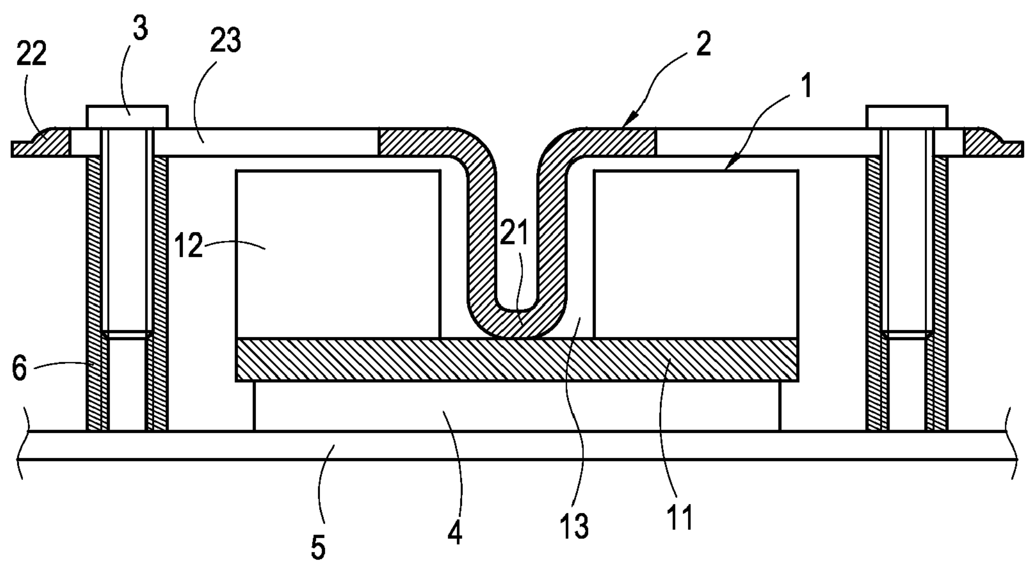
FIG. 5 is a cross-sectional view showing the assembling operation of the present invention.

With reference to FIG. 4, it is a schematic view showing the operation of the present invention. It can be seen that, when the positioning frame 2 is mounted on the base 1, the central pressing end 21 of the positioning frame 2 is accommodated in the sliding groove 13 of the base 1 to abut against the surface 11 of the base 1. The position of the positioning frame 2 can be adjusted with the free sliding of the pressing end 21 into the sliding groove 13, thereby to generate a sufficient space for the rotation of the positioning frame 2. With such arrangement, the position of the positioning frame 2 can be adjusted at any time depending on different locations and gravity centers for positioning. A locking element 3 penetrates through the screw holes 23 of the positioning frame 2 and is connected to a connecting end 6 on a substrate 5 of a heat-generating element 4, as shown in FIG. 5. Then, a downward force is generated to cause the pressing end 21 of the positioning frame 2 to abut tightly against the gravity center of the base 1, so that the base 1 and the heat-generating element 4 can be tightly adhered with each other. Therefore, a displacement may not occur between the base and the heat-generating element even subjected to an external force.

Figure 6:
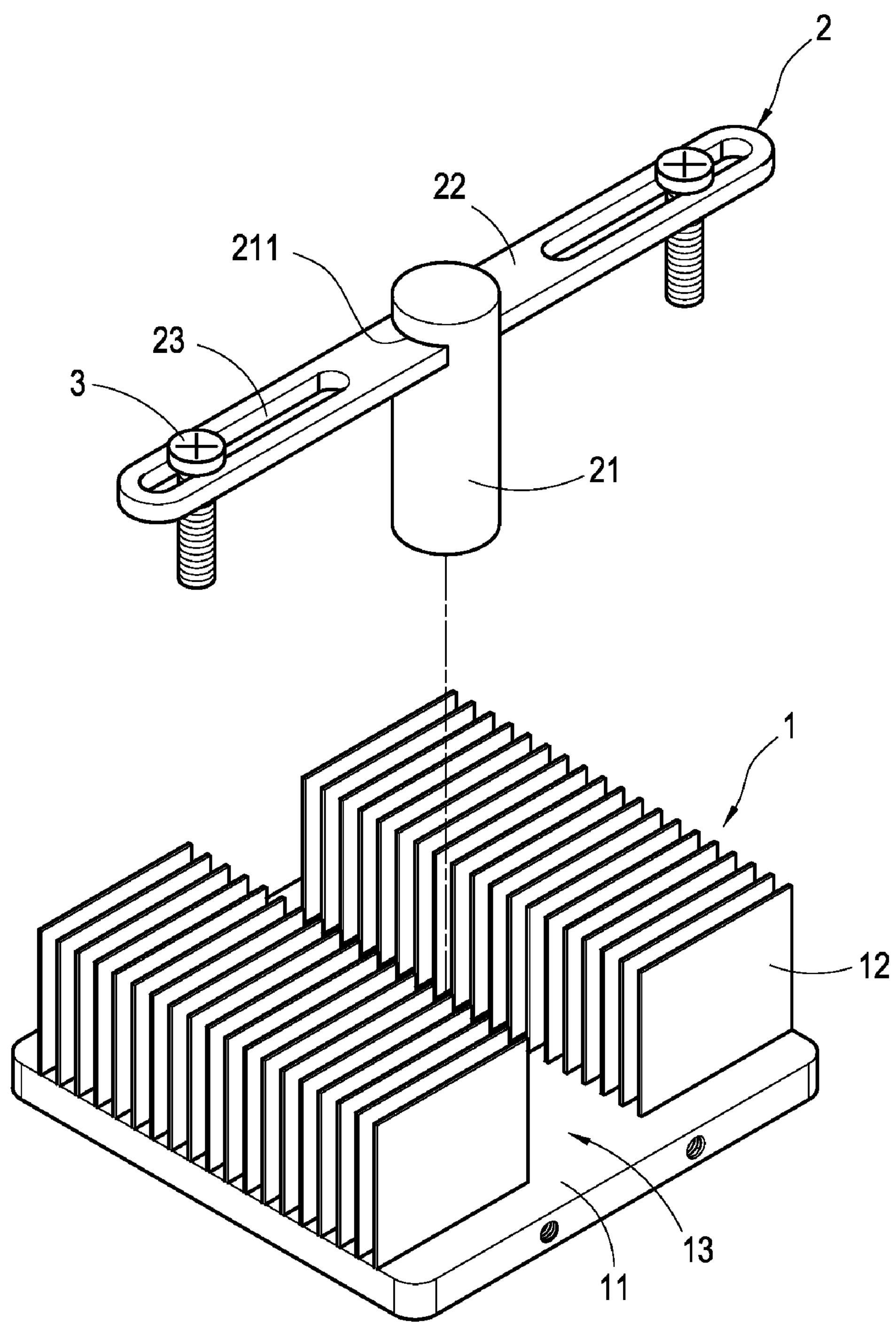
FIG. 6 is a schematic view showing the structure of the positioning frame in accordance with another embodiment of the present invention.

With reference to FIG. 6, it shows the positioning frame of another embodiment of the present invention. It can be seen that the positioning frame 2 and the pressing end 21 are formed of two assemblies. The pressing end 21 is formed into a pillar-like body. A penetrating hole 211 is formed on the pressing end 21 for allowing the penetration of an integral transverse rod 22 to form a positioning frame 2. Further, both end faces of the transverse rod 22 are provided with a screw hole 23, respectively. Then, the locking element 3 penetrates through the screw hole 23. With the locking action of the locking element 3, a downward force is generated to cause a pressing portion 21 of the positioning frame 2 to tightly abut against the surface 11 of the base 1. In this way, the position of the base 1 of the heat-dissipating device with respect to the heat-generating element 4 can be fixed.

Figure 7:
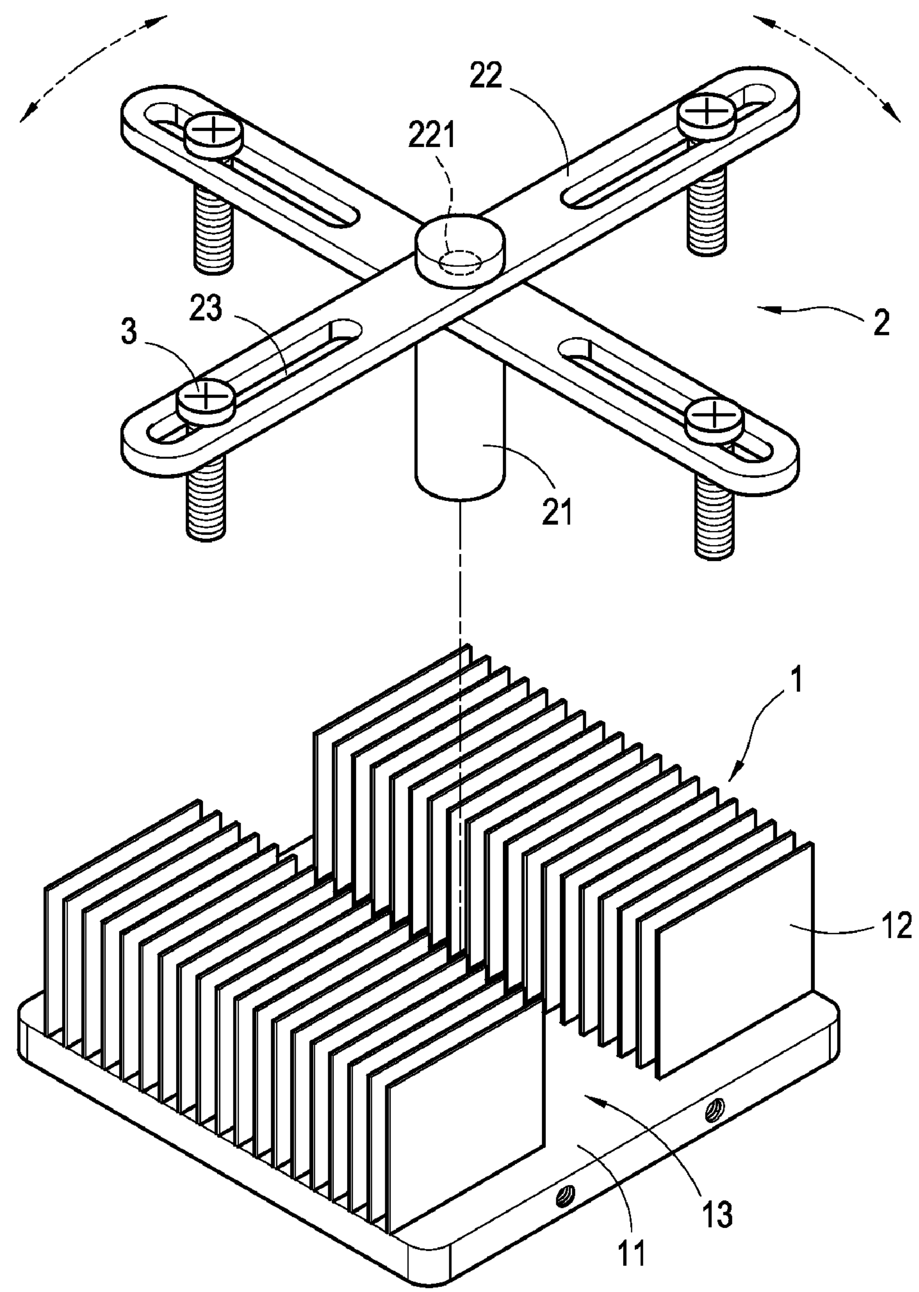
FIG. 7 is a schematic view showing the structure of the positioning frame in accordance with a further embodiment of the present invention.

Further, the connection of the transverse rod 22 of the positioning frame 2 and the pressing end 21 can be implemented in a manner as shown in FIG. 7. A through hole 221 is provided at a central position of the integral transverse rod 22. The upper end of the pressing end 21 can be exactly inserted into the through hole 221 to form a positioning frame 2. The transverse rod 22 can be also made of two pieces and may be vertically connected onto or penetrate through the pressing end 21 to form a positioning frame. Further, the positioning frame 2 can be simultaneously connected to two transverse rods 22 with one pressing end 21. The two transverse rods 22 are rotatable so that the transverse rods 22 can be adjusted depending on the different positions of the connecting ends.

Although the present invention has been described with reference to the foregoing preferred embodiments, it will be understood that the invention is not limited to the details thereof. Various equivalent variations and modifications can still be occurred to those skilled in this art in view of the teachings of the present invention. Thus, all such variations and equivalent modifications are also embraced within the scope of the invention as defined in the appended claims.

What is claimed is:

1. A fixing means for a heat dissipater, capable of fixing the heat dissipater provided on a substrate, comprising:

a base having a surface with a plurality of heat-dissipating pieces thereon, a center of the heat-dissipating piece having a sliding groove perpendicular to an orientation of the heat-dissipating pieces;

a pair of connecting ends formed on the substrate; and a positioning frame having at least one transverse rod connected vertically with a pressing end, the pressing end being accommodated in the sliding groove to abut against the surface of the base, the transverse rod being located over the heat-dissipating pieces, to have both ends extended out of the heat-dissipating pieces to connect with the pair of connecting ends, respectively;

wherein the positioning frame is connected to the connecting ends to generate a downward force, thereby to cause the pressing end to downwardly press the surface to fix the position of the base.

2. The fixing means for a heat dissipater according to claim 1, wherein each end of the transverse rod is provided with a screw hole and a locking element is used to secure the transverse rod with the connecting end through the screw hole.

3. The fixing means for a heat dissipater as claimed in claim 1, wherein the screw hole is an elongated hole such that the locking element is capable of sliding in the elongated hole.

4. A fixing means for a heat dissipater, the heat dissipater comprising a base having a surface with a plurality of heat-dissipating pieces thereon, a center of the heat-dissipating piece having a sliding groove, the fixing means comprising:

a first transverse rod, a second transverse rod and a pressing end, each of the first transverse rod and the second transverse rod defining a through hole therein, the pressing end passing through the through hole in each of the first transverse rod and the second transverse rod, the first transverse rod and the second transverse rod being capable of rotating around the pressing end, each of the first transverse rod and the second transverse rod defining two screw holes respectively in two ends thereof.

5. The fixing means for a heat dissipater as claimed in claim 4, further comprising four locking elements, the screw holes are elongated holes such that the locking elements are capable of sliding in the elongated holes.

6. A heat dissipater structure, comprising:

a base having a surface with a plurality of heat-dissipating pieces thereon, a center of the heat-dissipating piece having a sliding groove; and a fixing means for fixing the base on a substrate, the fixing means comprising:

a first transverse rod, a second transverse rod and a pressing end, each of the first transverse rod and the second transverse rod defining a through hole therein, the pressing end passing through the through hole in each of the first transverse rod and the second transverse rod, the first transverse rod and the second transverse rod being capable of rotating around the pressing end, each of the first transverse rod and the second transverse rod defining two screw holes in two ends thereof.

7. The heat dissipater as claimed in claim 6, further comprising four locking elements, the screw holes are elongated holes such that the locking elements are capable of sliding in the elongated holes.

* * * * *